Aug. 23, 1966 R. D. McNUTT 3,268,653

PRINTED CIRCUIT BOARD WITH SOLDER RESISTANT COATING IN THE THROUGH-HOLE CONNECTORS

Filed April 29, 1964 2 Sheets-Sheet 1

INVENTOR
ROBERT D. McNUTT

BY David N. Koffsky

ATTORNEY

United States Patent Office 3,268,653 Patented August 23, 1966

3,268,653

PRINTED CIRCUIT BOARD WITH SOLDER RESISTANT COATING IN THE THROUGH-HOLE CONNECTORS

Robert D. McNutt, Poughkeepsie, N.Y., assignor to International Business Machines Corporation, New York, N.Y., a corporation of New York Filed Apr. 29, 1964, Ser. No. 363,492
6 Claims. (Cl. 174—68.5)

This invention relates to printed circuits and more particularly to through-hole connectors having an engineering change capability.

Present day packaging techniques often dictate that printed circuit boards, either multilayer or single layer, be used as both the supporting mechanism for and electrical interconnections between modular electronic circuitry. In such schemes, the module pins are inserted into conductive through holes in the circuit board and the circuit board automatically provides the desired electrical interconnections. Such a packaging configuration is described in the IBM Journal of Research and Development, July 1963, pages 182–189 in the paper entitled "A Circuit Packaging Model for High Speed Computer Technology" by F. K. Buelow et al. The packaging technique described in the aforementioned article provides not only a high component density with resultant small intercircuit delays, but also a circuit package which is reproducible in high quantities at a reasonable cost.

There is, however, a problem in the use of such described packaging which is not apparent from its face. So long as the circuitry remains constant and unchanged there is no problem; however, when an engineering change is deemed desirable or necessary it is extremely difficult to provide such without injuring the supporting circuit board. This is due to the fact that when the pins of a circiut module are inserted into through-hole connections of the circuit board and soldered, the solder not only bonds to portions of the pin exterior to the circuit board, but also causes a bond between the pin and plated through holes in the interior of the board. Thus, when it is desired to unsolder a circuit module, an excessive amount of heat must be applied to break solder joints between the pins and plated through holes. Even if the solder joint is successfully broken, and the module removed, solder balls and imperfections remain within the plated through hole and prevent successful reinsertion of the module pins. Due, however to the fact that the soldered connection has proven much more reliable than any spring or like type of connector, it is highly desirable to retain such a connective scheme if satisfactory provisions for engineering change can be made.

Accordingly, it is an object of this invention to provide a conductive through hole to pin connection scheme which has a capability for engineering changes.

It is a further object of this invention to provide a through hole to pin connection scheme which can be reliably mass produced.

It is a further object of this invention to provide a through hole to pin connection scheme which can be broken and remade numerous times without resulting in the deterioration of the printed circuit card or module pin.

It is a further object of this invention to provide a through hole to pin connection scheme wherein a solder joint is utilized, the solder only connecting exterior portions of the pin and through hole.

In accordance with the above-stated objects, a conductive through-hole connector, which is adapted to receive a male pin connector, is coated with a solder temperature resistant insulative coating. This coating not only acts to prevent contact between the male pin connector and interior portions of the through-hole connector, but also protects the through-hole connector from abrasion by the insertion and withdrawal of the pin.

The foregoing and other objects, features and advantages of the invention will be apparent from the following more particular description of a preferred embodiment of the invention, as illustrated in the accompanying drawings.

Figure 1:
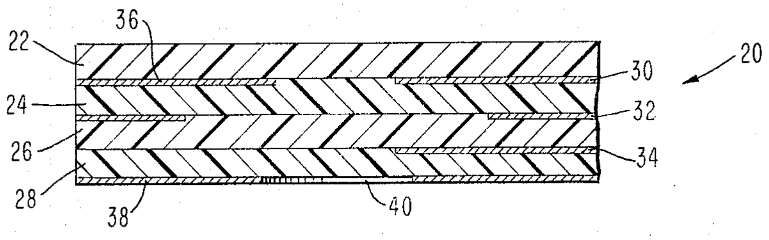
FIGS. 1–9 show the succession of steps required to produce the invention.

With reference now to FIG. 1, multilayer printed circuit board 20 is comprised of insulating panels 22, 24, 26 and 28 which have circuit conductors 30, 32, 34 and 36 laminated therebetween. Laminated to the under side of circuit board 20 is a conductive sheet 38 which has had a hole 40 etched therein. Insulating panels 22–28 may be of any suitable material such as epoxy glass and conductors 30–36 may likewise be of any conductor material, a preferred medium being copper. The process for producing such a printed circuit board is well known and will not be herein described.

Figure 2:
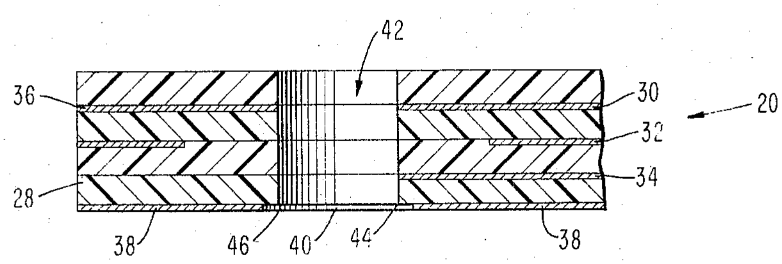

As shown in FIG. 2, a hole 42 is drilled, etched or otherwise produced in circuit board 20 exposing conductors 30, 34 and 36. The diameter of hole 42 is made somewhat less than the etched hole 40 in conductor sheet 38 for a purpose to be hereinafter described.

Figure 3:
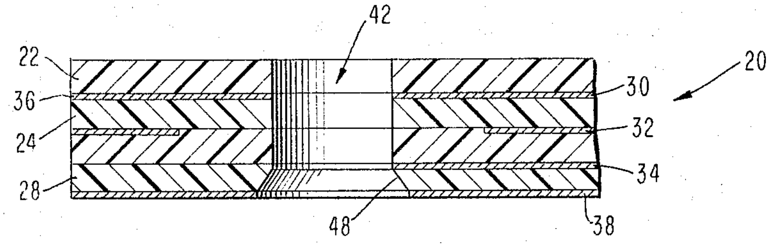

Next, an abrasive slurry is directed through etched opening 40 at hole 42, causing exposed edges 44 and 46 of circuit panel 28 to be eroded. Thus, as shown in FIG. 3, a chamfered section 48 is created which offsets the inner diameter of hole 42 from the edge of conductive sheet 38. Any module pin inserted down through hole 42 to be connected to conductive sheet 38 by a solder joint will have its upper end constrained by the module to which it is attached, but its lower extremity will be free to move in accordance with the forces exerted on it. For this reason, conductor 38 is offset from the diameter of the hole 42 to prevent any accidental shorting. Additionally, if it is desired to remove the pin from hole 42, the joint must be unsoldered giving rise to the possibility of remanent solder whiskers. By offsetting conductive area 38 from hole 42 a greater displacement between the conductive lands and the pin is achieved thereby preventing undesired connections.

Figures 4, 5:
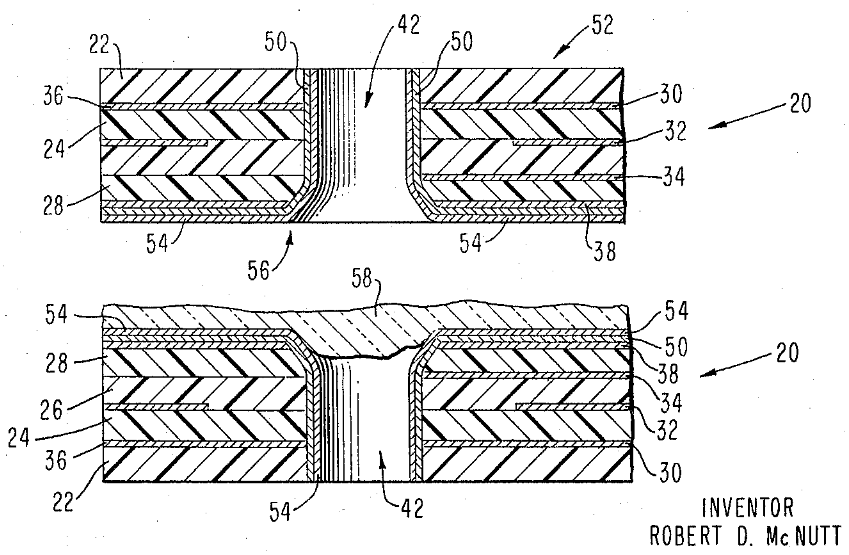

As shown in FIG. 4, hole 42 and conductive sheet 38 are next coated with several additive layers of conductive material using commercially available processes. First, a very thin copper layer 50 is electrolessly deposited over the entire board. Upper surface 52 of circiut board 20 may be masked to prevent the electroless copper from depositing thereon or, the copper may be allowed to deposit thereon and be subsequently sanded off or removed by any other acceptable method. Once a layer of electroless copper 50 has been deposited, a thicker layer of copper 54 is electroplated over the entire surface to build up the thickness of the conductor. It should now be noted, that inner conductors 30, 34 and 36 are connected by the combined copper platings 50 and 54 to conductive sheet 58. Suitable materials for electrolessly depositing copper layer 50 are produced by the Shipley Co., Wellesley, Mass.

Now, if this were merely a description of a conventional plated through hole, the next step would be to etch the under side 56 of circuit board 20 to the desired circuit configuration, insert the male pin connector into hole 42 and solder. As is obvious, however, not only would the solder bond to the under side conductor 56 but it would also run up the sides of hole 42 bonding the pin to the hole for substantially the hole's entire length. Thus, if it were subsequently desired to remove the pin from hole 42 an excessive amount of heat would be required to melt the solder and the result would be (in addition to possible harm to the circuit board) solder nodules which could prevent the subsequent reinsertion of a pin.

To prevent this problem and provide a printed circuit board connection between a plated through hole and a pin which is inserted therein, it has been discovered that the application of an insulating layer to the interior walls of the hole provides not only desired protection to the conductive sides of the hole but also prevents any bonding of the pin to the sides of the hole as a result of capillary solder action. In FIG. 5, circuit board 20 is turned over so that the chamfered end of hole 42 faces upwardly.

Next, a fluid or viscous solder epoxy resist 58 is applied to the upper surface of circuit board 20. To accomplish this, circuit board 20 and the epoxy resin must be heated to a temperature where the epoxy resist 58 begins to flow, e.g., 200° F. The epoxy solder resist must fulfill certain requirements before it is adapted to use with this invention. Before curing, the epoxy solder resist must achieve a fluid state at a relatively low temperature which will not affect the circuit board; and after curing, it must be resistant to solder temperatures (500° for 10 seconds) and produce a hard nondeformable substance. Such resins are known to the market and may be obtained commercially. For instance, epoxy solder resist #180, produced by Allied Products Division, Allied Printed Circuit Corp., Bellmont, Mass., or the Kenics Corp., Wakefield, Mass. (alternate source), Araldite 502 produced by the Ciba Products Corp., Fairlawn, N.J., and Furane Epocast 1448 produced by the Furane Plastics, Inc., Los Angeles, Calif., are all suitable epoxy solder resists.

Figure 6:
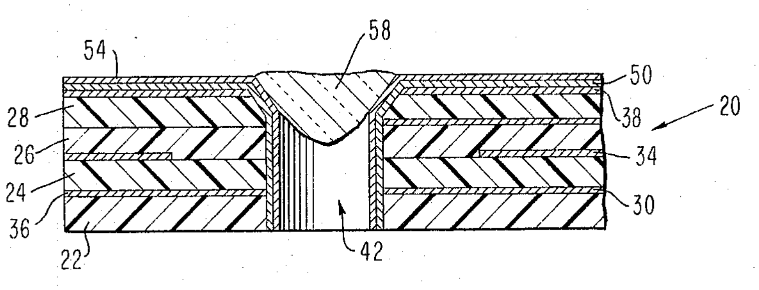

By applying heat to epoxy resist 58 and circuit board 20, and mechanically spreading the resist 58, the entire surface of the board and all through holes are covered. Immediately after the aforementioned step has been accomplished, the excess epoxy resin resist is squeegeed off of the top surface of the circuit board 20 (FIG. 6) thereby forcing additional epoxy resist 58 down into hole 42 and removing the excess from the top surface.

Figure 7:
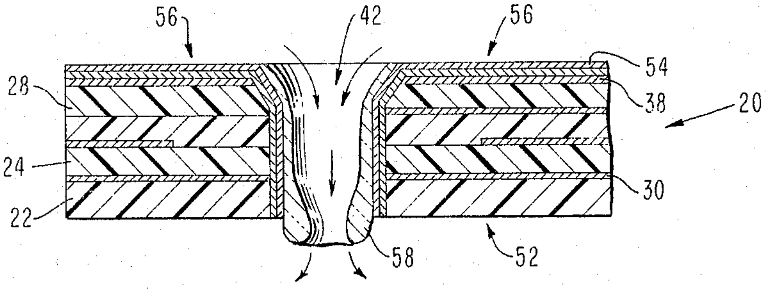

Referring next to FIG. 7, heated air is again applied to the upper surface 56 of circuit board 20 and a pressure differential is created across the board by applying a small vacuum to surface 52. This causes a flow of heated air through hole 42 which in turn causes the fluid epoxy resist 58 to flow and coat the sides of the hole. As the excess epoxy resist emerges from hole 42 at surface 52, it is squeegeed away.

Certain limitations must be placed upon the pressure differential applied across circuit board 20. Since it is desired that a relatively thick coating of epoxy resist be applied to the sides of hole 42, the vacuum must not be too great or else it will produce too thin a coating. It was unexpectedly found that a small vacuum not only produced the desired thickness of coating but also produced a desirable collar of epoxy resist around the lower extremity of hole 42. While the phenomenon which produces the collar is not entirely understood, it is thought to be the result of the aerodynamics of the heated air being drawn through hole 42. In short, as the heated air exhausts from hole 42, it sees a considerable area of lower pressure which tends to cause it to accelerate resulting in a pressure drop. The fluid epoxy resist 58 in attempting to fill in the aforementioned low pressure area expands and creates a collar.

It has been found in applying the above-mentioned technique to a circuit board having 8000–30 mil diameter holes with epoxy solder resist #180 (as aforementioned) that a pressure differential of approximately 6 inches of water (.218 p.s.i.) creates the desired effect. With this particular example, it was found that the pressure differential could be varied by plus or minus 15% with no effect on the desired coating thickness and collar formation. For other sizes and numbers of through-hole connectors, the exact desired pressure differential would have to be empirically determined.

Figure 8:
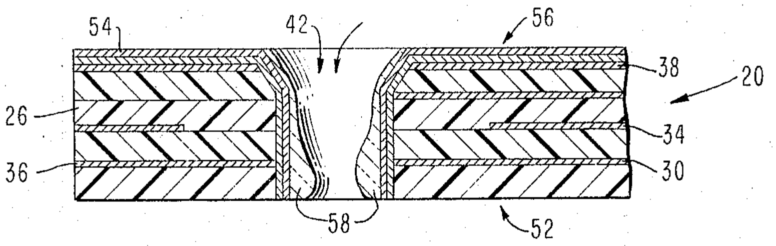
Figure 9:
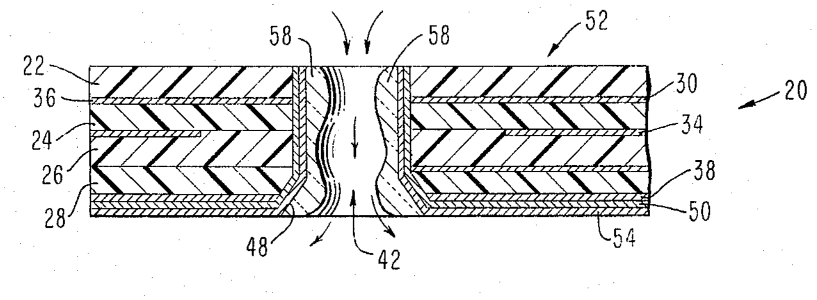

To cure epoxy resist coating 58, the pressure differential is maintained across circuit board 20 for 45 minutes so that the heated air passing through hole 42 acts to cure the epoxy resist. At the end of the 45 minutes, the pressure differential is removed, and circuit board 20 then appears as shown in FIG. 8. Circuit board 20 is then turned over, and the epoxy resist coating process repeated. The result of this operation is as shown in FIG. 9.

The reason for commencing the epoxy resist coating process with chamfered end 48 of hole 42 facing upwardly is that it was found that an initial layer of epoxy resist coating in chamfer area 48 facilitated the subsequent collar build up in the reverse coating process. As can be seen from FIG. 9, epoxy resist 58 completely coats the interior walls of conductive through-hole 42 and additionally provides symmetrical collars at either end of the holes. At this point, the insulation of hole 42 is completed and it only remains to produce the desired circuitry on surface 56 of circuit board 20, insert the desired pin connector, and connect it to the conductive land area.

Figure 10:
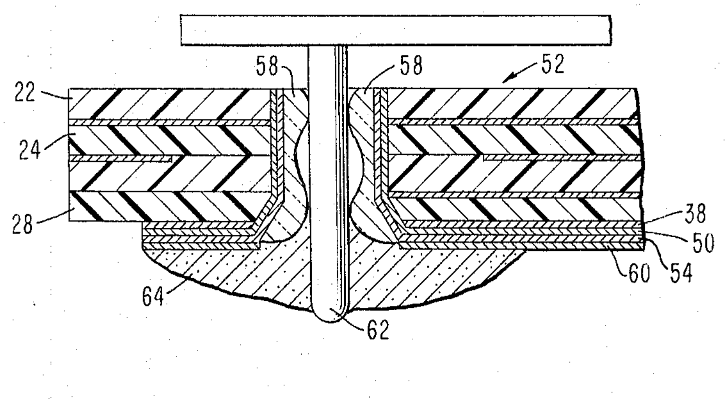
FIG. 10 illustrates the invention after a pin has been inserted and soldered in place.

After the epoxy resist has been fully cured, copper layer 54 is lightly sanded to remove any residual epoxy from the copper surface. To form the desired conductors in the composite conductive layers 54, 50 and 38 any well known commercial copper etching process can be utilized. For instance, a screened acid resist such as K2 Resist ink, a product of the Photocircuits Corp., Glen Cove, New York, may be applied to areas which are to be subsequently etched leaving copper exposed where the circuitry is desired. Next, a layer 60 of gold (FIG. 10) may be applied to provide a protective acid resistant coating over the desired surface areas. The acid resist may then be removed with a trichlorethylene vapor degreaser and the exposed copper areas etched with a ferric chloride solution, causing the desired circuitry to be formed into copper layers 38, 50 and 54. Pin 62 is then inserted into hole 42 and dip soldered to produce a solder joint between it and the circuit land. As can be seen in FIG. 10, solder 64 is prevented from flowing up into hole 42 by the collar portion of epoxy resist 58. Even if the solder flows up the length of pin 62, it will not bond with the epoxy resist and thus by the simple expedient of unsoldering the tip area of pin 62 the entire pin may be easily removed.

While the invention has been particularly shown and described with reference to a preferred embodiment thereof, it will be understood by those skilled in the art that various changes in form and details may be made therein without departing from the spirit and scope of the invention.

What is claimed is:

1. In a printed circuit board, the combination comprising:

a through-hole connector receiving a male pin connector, the sides of said through-hole being coated with a conductive material which electrically connects to conductive circuit lands; and a solder resistant insulative coating adherent to the conductive sides of said through-hole, said coating completely covering and insulating said conductive material from said male connector.

2. The invention as defined in claim 1 further including a conductive land communicating with said through-hole connector on an exterior surface of said printed circuit board; and conductive means connecting said male connector to said last named conductive land.

3. The invention as defined in claim 2 wherein said conductive means is solder which bridges said insulative coating in connecting said male connector to said conductive land.

4. The invention as defined in claim 1 wherein said insulative coating is thicker at the extremities than in the interior of said through-hole, said thicker portion of said insulative coating acting to offset said male connector from the interior coating of said through hole.

5. The method of coating interior surfaces of a conductive through-hole connector in a printed circuit board with a solder resistant insulative coated material comprising the steps of:

inserting said insulative material in a fluid state into one end of said through hole;

applying a vacuum to the other end of said through hole which draws sufficient air through said hole to cause said fluid insulating material to coat the interior walls of said through hole and to build up a collar of material at said other end;

inserting said insulative material in a fluid state into said other end of said through hole; and applying a vacuum to said one end of said through hole to draw sufficient air through said hole to cause said fluid insulative material to coat the interior walls of said through hole and to build up a collar of insulative material at said one end.

6. The invention as defined in claim 5 further including the step of heating the air which is drawn through said through hole by said applied vacuum to cause a curing of said insulative material.

No references cited.

LEWIS H. MYERS, *Primary Examiner.*

DARRELL L. CLAY, *Examiner.*